United States Patent [19]

Esaki et al.

[11] 4,205,331
[45] May 27, 1980

[54] INFRARED OPTICAL DEVICES OF LAYERED STRUCTURE

[75] Inventors: Leo Esaki, Chappaqua; George A. Sai-Halasz, Mohegan Lake; Leroy L. Chang, Lake Mohegan, all of N.Y.

[73] Assignee: The United States of America as represented by the Secretary of the Army, Washington, D.C.

[21] Appl. No.: 914,100

[22] Filed: Jun. 9, 1978

[51] Int. Cl.$^2$ .............................................. H01L 27/14
[52] U.S. Cl. ........................................ 357/30; 357/16; 357/4; 357/3
[58] Field of Search ........................... 357/3, 16, 30, 4

[56] References Cited

U.S. PATENT DOCUMENTS

| | | | |
|---|---|---|---|
| 3,626,257 | 12/1971 | Esaki | 317/234 R |
| 3,626,328 | 12/1971 | Esaki | 331/107 G |
| 4,088,515 | 4/1975 | Blakeslee | 148/175 |
| 4,103,312 | 7/1978 | Esaki | 357/16 |
| 4,137,542 | 1/1979 | Esaki | 357/16 |

*Primary Examiner*—Martin H. Edlow
*Attorney, Agent, or Firm*—Nathan Edelberg; Sheldon Kanars; Jeremiah G. Murray

[57] ABSTRACT

An optical device is disclosed which includes first and second superlattice semiconductor regions. The first superlattice semiconductor region includes a plurality of alternating barrier and light absorbing layers which absorbs light of a first light frequency. The second superlattice region also includes a plurality of alternating barrier and light absorbing layers. However, the light absorbing layers of the second superlattice semiconductor region absorbs light of a different frequency.

4 Claims, 2 Drawing Figures

INFRARED OPTICAL DEVICES OF LAYERED STRUCTURE

The invention described herein may be manufactured and used by or for the Government for governmental purposes without the payment of any royalties thereon or therefor.

FIELD OF THE INVENTION

This invention relates to optical detection devices and particularly to infrared optical detection devices.

BACKGROUND OF THE INVENTION

On Dec. 7, 1971, two patents issued in which one of the coinventors hereof, Leo Esaki, was also a coinventor, such patents being U.S. Pat. Nos. 3,626,257 and 3,626,328 entitled "Semiconductor Device with Superlattice Region" and "Semiconductor Bulk Oscillator", respectively, both of which are incorporated herein by reference. These patents teach how to produce semiconductor devices with superlattice regions, the electrical properties thereof, and point out the prior state of the art with respect to theoretical considerations involving wave propagation in periodic structures, and the bulk negative resistance devices resulting therefrom.

Prior to our invention, Leo Esaki and Raphael Tsu, realized that the normal conduction band energy levels of a superlattice region are modified to produce supplemental allowed levels separated by infrared frequencies in superlattice structures. They taught that such devices could be useful as sources of infrared radiation and as laser amplifiers and oscillators.

Radiation sensitive devices in the near IR visible region are presently available which are responsive to such radiation. These are commonly known as solar cells. Thus far, no radiation responsive devices in the far IR region have been developed which have sensitivity comparable to such known solar cells.

BRIEF DESCRIPTION OF THE INVENTION

In accordance with the teachings of this invention it has been recognized that the superlattice structures having supplemental allowed levels can be employed as an infrared optical detector having high sensitivity in the far IR region comparable to that of a typical solar cell in the near IR or visible region. This is accomplished by providing an optical device comprising at least first and second superlattice semiconductor regions in which the first superlattice semiconductor region includes a plurality of alternating barrier and light absorbing layers in which the light absorbing layers each have a pair of allowed states separated by an energy corresponding to a first light frequency, and the second superlattice semiconductor region includes a plurality of alternating barrier and light absorbing layers in which the light absorbing layers each have a pair of allowed states separated by an energy corresponding to a second light frequency different from said first light frequency.

In the preferred embodiment the barrier layers of each of the first and second superlattice regions are of a thickness between 50 to 150 angstroms. The barrier layers are composed of gallium aluminum arsenide, while the light absorbing layers are composed of gallium arsenide.

The optical devices may also include means for selectively sensing current flowing in each of the superlattice regions to provide an indication of radiation impinging thereon.

DESCRIPTION OF THE DRAWING

For a more complete understanding of the invention reference should be made to the following detailed description and figures.

DETAILED DESCRIPTION OF THE INVENTION

Figure 1:
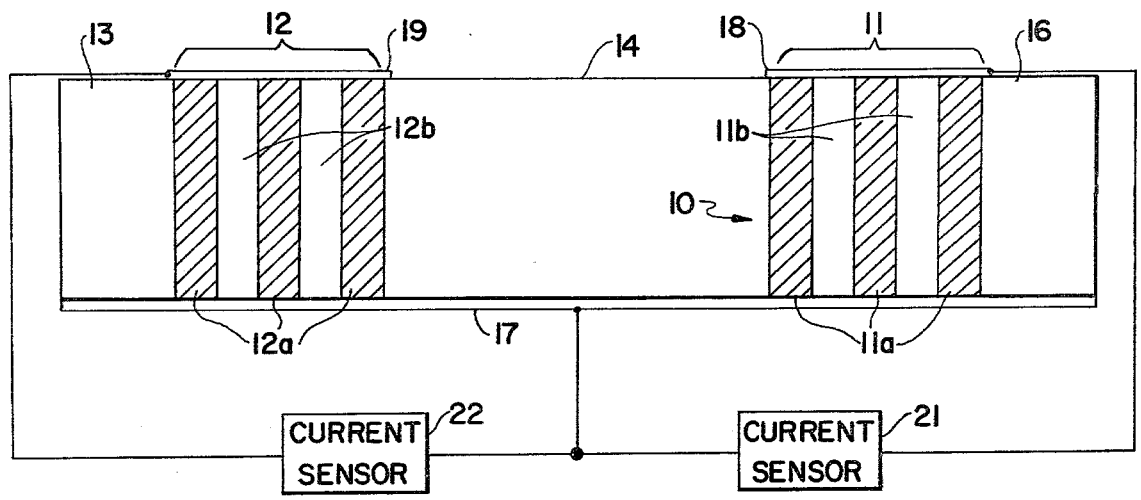
FIG. 1 is a schematic representation of an optical device constructed in accordance with this invention, and a circuit for operating the same.

Referring now to FIG. 1, we see an optical semiconductor device 10 having two semiconductor superlattice regions 11 and 12 and three insulating regions 13, 14, and 16. The device 10 also includes a common contact 17 which is connected to one side of the superlattice region 11 and 12. Contacts 18 and 19 are connected to the other side of the superlattice regions 11 and 12, respectively. Each of the semiconductor superlattice regions include a plurality of alternating barrier and light absorbing layers. The barrier layers 11a and 12a are each an alloy of $Ga_yAl_{1-y}As$, while the light absorbing layers 11b and 12b are constructed of GaAs. The semiconductor superlattice is therefore constructed from a plurality of heterojunctions, i.e., a semiconductor junction formed at the interface of two different semiconductor materials.

Figure 2:
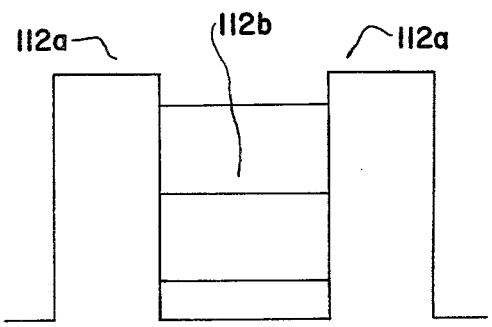
FIG. 2 is an energy level diagram showing the potential well in a light absorbing layer of an optical device constructed in accordance with the teachings of this invention.

FIG. 2 shows the conduction band energy diagram for portions of the superlattice regions 11 and 12 of FIG. 1. The regions labeled 112a represent the conduction band of the hatched areas of 11a and 12a of FIG. 1 while the region designated 112b represents the conduction band of the layers 11b and 12b. It is noted that the supplemental allowed levels are present in the region 112b forming a one dimensional potential well. Because of the relative parallel nature of the supplemental allowed levels in the energy vs momentum relationship, the absorption characteristic of the layers 11b and 12b is defined by a very narrow band width and is quite strong. (See for example IBM Technical Disclosure Bulletin, Volume 20, No. 5 October 1977, FIG. 2.) Thus, these devices can be employed to selectively detect precise infrared frequencies with high spectrometer resolution. On the other hand, however, such individual superlattice regions cannot be employed as a wide band detector.

In accordance with the teachings of this invention, more than one superlattice region is employed wherein each superlattice region absorbs light at a different frequency permitting the manufacture of a wide band detector, if desired. This is accomplished by providing a different set of supplemental allowed states in each region separated by energies corresponding to different light frequencies.

Layers 11a, 11b, 12a, and 12b should each be between 50 and 150 angstroms to provide the characteristics desired. There can, however, be adjustments in those ranges to adjust the absorption spectrum. Further, the absorption spectrum can be adjusted by varying the ratios of the constituents in the gallium aluminum arsenide.

Referring again to FIG. 1, we see that a pair of current sensors 21 and 22 are employed to individually detect the currents thru the individual superlattice regions. In this way an ultra-sensitive detector with high spectral resolution is achieved without a separate spectromator. Of course, if the energy from the various superlattice regions are combined, a wide band detector is accomplished.

While this invention has been described with respect to a particular embodiment hereof, numerous others will become obvious to those of ordinary skill in the art in light hereof, and it is therefore not intended that the foregoing description be read in a limiting sense, and that the scope of the invention be defined by the appended claims.

What is claimed is:

1. An optical detection device comprising: first and second superlattice semiconductor regions joined by an insulator; each said region including two different materials arranged alternately in parallel layers to form a plurality of semiconductor heterojunctions; the bottom of the conduction band of one of said materials in each said region being lower than the bottom of the conduction band of the other of said materials in said region to form a series of potential wells and potential barriers across each said region; each said potential well having at least two quantized allowed energy states separated by an energy corresponding to a light frequency; said energy separation for all of said potential wells being equal in each said region and being different for different ones of said regions; and current sensing means attached to said layers for selectively sensing currents flowing in said regions.

2. An optical device according to claim 1, wherein each said potential well is of a thickness of between 50 to 150 angstroms.

3. An optical device according to claim 2, wherein said layers forming said potential barriers are composed of an alloy of gallium aluminum arsenide and said layers forming said potential wells are composed of an alloy of gallium arsenide.

4. An optical device according to claim 3, wherein the ratios of the alloy constituents of said gallium aluminum arsenide are different for different ones of said regions.

* * * * *